United States Patent
Tomoyasu

(10) Patent No.: US 7,172,675 B2
(45) Date of Patent: Feb. 6, 2007

(54) OBSERVATION WINDOW OF PLASMA PROCESSING APPARATUS AND PLASMA PROCESSING APPARATUS USING THE SAME

(75) Inventor: Masayuki Tomoyasu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 238 days.

(21) Appl. No.: 10/742,779

(22) Filed: Dec. 23, 2003

(65) Prior Publication Data

US 2004/0134426 A1    Jul. 15, 2004

(30) Foreign Application Priority Data

Dec. 27, 2002    (JP) .............................. 2002-379930

(51) Int. Cl.
*H01L 21/00* (2006.01)
*C23C 16/00* (2006.01)

(52) U.S. Cl. ............................ 156/345.24; 156/345.25; 156/345.27; 118/712; 204/192.13; 204/192.33; 204/298.03; 204/298.33

(58) Field of Classification Search ........... 156/345.24, 156/345.25, 345.27; 204/192.13, 192.33, 204/298.03, 298.33; 118/712

See application file for complete search history.

(56) References Cited

U.S. PATENT DOCUMENTS

| | | | |
|---|---|---|---|
| 6,390,019 B1 * | 5/2002 | Grimbergen et al. ... | 118/723 R |
| 6,427,621 B1 | 8/2002 | Ikegawa et al. | |
| 6,503,364 B1 * | 1/2003 | Masuda et al. ........ | 156/345.24 |
| 6,712,927 B1 * | 3/2004 | Grimbergen et al. .. | 156/345.24 |
| 6,831,742 B1 * | 12/2004 | Sui et al. ..................... | 356/369 |

FOREIGN PATENT DOCUMENTS

JP    09186089 A  *  7/1997

* cited by examiner

*Primary Examiner*—Ram N. Kackar
(74) *Attorney, Agent, or Firm*—Oblon, Spivak, McClelland, Maier & Neustadt, P.C.

(57) ABSTRACT

An observation window airtightly installed at a wall of a processing room of a plasma processing apparatus includes a body having a through hole with an opening facing the processing room, a transparent member installed at a side of the body opposite to the processing room and a magnetic pole pair having two different magnetic poles disposed opposite each other with the hole interposed therebetween. The magnetic pole pair is configured to have a sufficient magnetic field strength to prevent electrons which form a plasma in the processing room from reaching the transparent member through the hole.

2 Claims, 5 Drawing Sheets

OBSERVATION WINDOW OF PLASMA PROCESSING APPARATUS AND PLASMA PROCESSING APPARATUS USING THE SAME

FIELD OF THE INVENTION

The present invention relates to a plasma processing apparatus for processing, e.g., a semiconductor wafer; and, more particularly, to an observation window for measuring particles in a processing room and/or detecting an emission spectrum of plasma and a plasma processing apparatus including same.

BACKGROUND OF THE INVENTION

Conventionally, in a plasma processing apparatus for processing, e.g., a semiconductor wafer, an observation window has been used to measure particles in a processing room and/or detect an emission spectrum of plasma. For example, there has been disclosed a method for measuring particles in a plasma (see, e.g., Japanese Patent Laid-open Publication No. 1997-203704). In this method, a laser light is irradiated from a side wall of the processing room; the light is reflected or scattered when colliding against floating particles in the plasma and the particles are measured based on intensity variation of the reflected light or the scattered light observed through the observation window.

In an aspect of measuring the reflected light or the scattered light when a laser light is irradiated to floating particles in the plasma, it is preferable that the observation window for measuring the reflected light or the scattered light is set to be sufficiently large. However, in case the observation window is large, electrons which form the plasma may be introduced into the observation window. As a result, a plasma may be newly formed in the observation window to produce particles or deposits on the observation window, so that light efficiency may be deteriorated and light dispersion may occur at the location of the observation window. Therefore, a high-precision measurement of particles may be difficult to accomplish.

SUMMARY OF THE INVENTION

It is, therefore, a primary object of the present invention to provide an improved observation window of a plasma processing apparatus wherein a cleaning or replacement cycle period of the observation window can be extended by preventing the observation window from being etched or reaction products from adhering thereto, thereby increasing the productivity of the apparatus.

It is another object of the present invention to provide an improved plasma processing apparatus capable of efficiently performing a measurement of particles, detection of an emission spectrum of plasma and the like by incorporating the improved observation window described above.

In accordance with one aspect of the present invention, there is provided an observation window airtightly installed at a wall of a processing room of a plasma processing apparatus, including: a body having a through hole with an opening facing the processing room; a transparent member installed at a side of the body opposite to the processing room; and a magnetic pole pair having two different magnetic poles disposed opposite each other with the through hole interposed therebetween, the magnetic pole pair being configured to have a sufficient magnetic field strength to prevent electrons which form a plasma in the processing room from reaching the transparent member through the hole.

In accordance with the novel structure, the electrons can be prevented from being introduced from the plasma into the hole by incorporating the magnetic pole pair wherein the magnetic pole pair has a sufficient magnetic field strength to prevent the electrons which form the plasma in a processing room from reaching the transparent member through the hole, the magnetic field strength being determined based on an electron energy. In this way, a hollow cathode discharge (abnormal discharge) in the hole can be prevented. In the present invention, "hole" denotes a space of a predetermined shape being opened toward the processing room and includes a shape generally called a slit.

The magnetic pole pair may be configured to have a sufficient magnetic field strength to prevent electrons from reaching the transparent member through the hole depending on the size of the processing room and an electron energy. That is, the magnetic field strength may be varied depending on the size of the processing room. For example, in case the diameter of the processing room is about 450 mm and the electron temperature is about 20 eV or less, electrons can be prevented from being introduced from the plasma into the hole by setting the magnetic field strength of the magnetic pole pair to be about 8.7 G or more. Also, in case the diameter of the processing room is about 600 mm and the electron temperature is about 20 eV or less, electrons can be prevented from being introduced from the plasma into the hole by setting the magnetic field strength of the magnetic pole pair to be about 6.5 G or more. In this way, the hollow cathode discharge in the hole can be prevented.

Further, when viewed at an observation target location in the processing room, an inner end of the hole may have a height corresponding to about 1.5°. For example, in case of measuring particles in the processing room, "the observation target location in the processing room" is a location vertically above any point of a whole surface of an object to be processed by plasma, including an opposite (inner) end thereof disposed farthest from the observation window. Further, "the height corresponding to about 1.5°" means that the angle between a line connecting an upper edge of the inner end of the hole to the observation target location and a line connecting a lower edge of the inner end of the hole to the observation target location is about 1.5°. For example, in case of performing a measurement by using a laser light in such a configuration, a backside scattered light can be collected sufficiently and, at the same time, electrons can be prevented from reaching the transparent member of the observation window.

Furthermore, the ratio of a height of an opening of the hole to a distance (depth) from the opening to the transparent member (height:distance) can be set to be about 1:4. With such configuration, deterioration of transmittance due to deposition of radicals on the observation window can be prevented. In addition, the hollow cathode discharge at the location of the observation window can be prevented. Therefore, an effective measurement can be performed while maintaining the S/N ratio stable for an extended period of time.

In addition, the height of the opening of the hole may be set to be smaller than the height of the inner end of the hole so that the amount of electrons and radicals introduced into the hole can be further decreased.

Moreover, the transparent member may be configured to function as a sealing member for keeping the processing room airtight so as to obviate the need to have a separate sealing member, thereby resulting in a decreased cost and a compact apparatus.

Further, in case of using a laser transmitting material as the transparent member, e.g., quartz or sapphire, an observation process using a laser light, e.g., a particle measuring process, can be carried out. Moreover, in case of using a member capable of transmitting an emission spectrum of plasma as the transparent member, a variation of the emission spectrum thereof can be detected, so that endpoint detection of the plasma processing can be carried out, for example.

In accordance with another aspect of the present invention, there is provided a plasma processing apparatus incorporating the observation window described above. The plasma processing apparatus may be provided with one or more of the following units at a side of the observation window opposite to the processing room:

(a) laser irradiating unit for irradiating a laser light into the processing room through the observation window;

(b) laser detecting unit for detecting the irradiated laser light through the observation window; and (c) spectrum detecting unit for detecting an emission spectrum of a plasma generated in the processing room.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
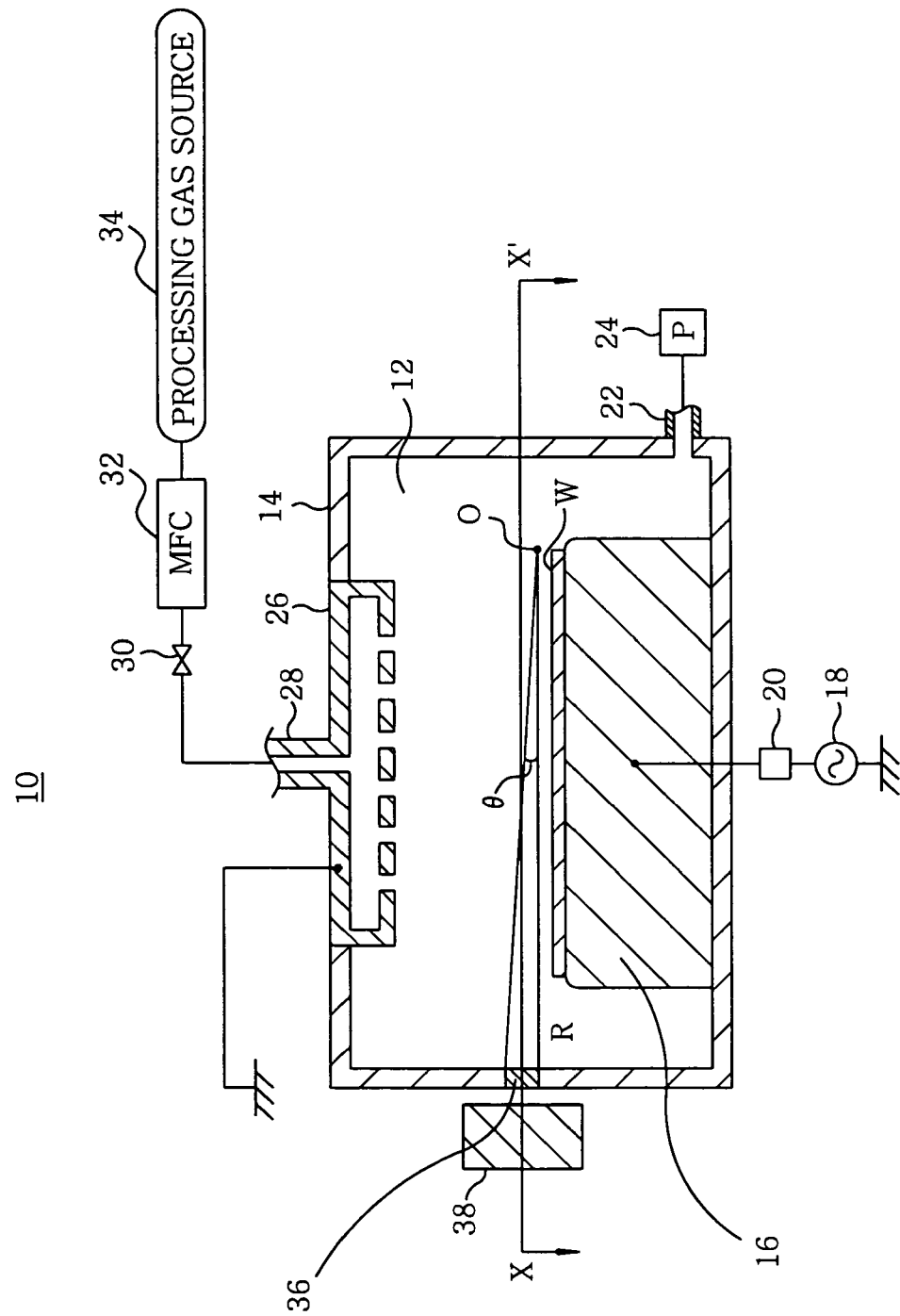
FIG. 1 shows a schematic cross sectional view of a parallel plate plasma etching apparatus.

Preferred embodiments of an observation window and a plasma processing apparatus incorporating the same in accordance with the present invention will now be described in detail with reference to the accompanying drawings. In the specification and drawings, like reference numerals will be used to refer to like components having the substantially same function and structure and repeated descriptions thereof will be omitted.

[Plasma Etching Apparatus 10]

In a first preferred embodiment of the present invention, a plasma etching apparatus 10 will be described with reference to FIG. 1 as an exemplary plasma processing apparatus. In the plasma etching apparatus 10 as shown in FIG. 1, a processing room 12 is formed into a processing chamber 14. A lower electrode 16 on which an object to be processed, e.g., a semiconductor wafer W, may be mounted is disposed at a bottom portion of the processing chamber 14. A high frequency power generated from a high frequency power supply 18 is provided to the lower electrode 16 through a matching circuit 20. If the high frequency power is provided from the high frequency power supply 18 to the lower electrode 16, a plasma is generated in the processing room 12.

An exhaust line 22 is installed at a lower portion of a side wall of the processing chamber 14. Because a vacuum exhaust unit 24 is connected to the exhaust line 22, the inside of the processing chamber 14 can be maintained in a certain depressurized atmosphere by operating the vacuum exhaust unit 24.

An upper electrode 26 opposing the lower electrode 16 is disposed at an upper portion of the processing chamber 14. The upper electrode 26 is connected to a gas introducing line 28, which is in turn connected to a processing gas source 34 through a valve 30 and a MFC (mass flow controller) 32. Therefore, a predetermined processing gas is supplied from the processing gas source 34 to the processing room 12 through the MFC 32, the valve 30 and the upper electrode 26 sequentially.

An observation window 36 is installed at a side wall of the processing chamber 14. The observation window 36 is used to measure particles generated in the processing room 12 or detect an emission spectrum of plasma. A feature of the preferred embodiment of the present invention resides mainly in the structure of the observation window 36. The structure of the observation window 36 will be described later. In the preferred embodiment of the present invention, how the observation window 36 may be used to measure particles generated in the processing room 12 will now be exemplarily described.

A particle measuring instrument 38 is installed outside of the processing chamber 14 facing toward the observation window 36. The particle measuring instrument 38 is configured to include a laser irradiating unit (not shown) for irradiating a laser light into the processing room 12 and a laser detecting unit (not shown) for detecting a laser light reflected or scattered by particles generated in the processing room 12. The laser irradiating unit irradiates the laser light into the processing room 12 through the observation window 36. The reflected or scattered laser light is detected by the laser detecting unit through the observation window 36. Measurement of particles in the processing room is carried out based on the detected results of the laser detecting unit.

In FIG. 1, reference numeral O represents a preferred observation target location (particle measuring location) of the observation window 36. The particle measuring location O is located at an intersecting point of a line horizontally extending from the bottom edge of the observation window 36 and a line vertically extending from an end of the wafer W disposed farthest from the observation window 36. Also, reference numeral θ is an angle for defining a height of the observation window 36. If the sum of a radius of the processing room 12, a radius of the wafer W and a depth of the observation window 36 (i.e., depth of the hole thereof) is expressed by R, the height of the observation window 36 becomes Rtanθ. The height of the observation window 36 will be described in more detail later.

Until now, the structure of the plasma etching apparatus 10 has been described with reference to FIG. 1. Hereinafter, a structural element featuring the preferred embodiment of the inventive observation window 36 will be described with reference to FIGS. 2 to 5.

[Observation Window 36]

Figure 2:
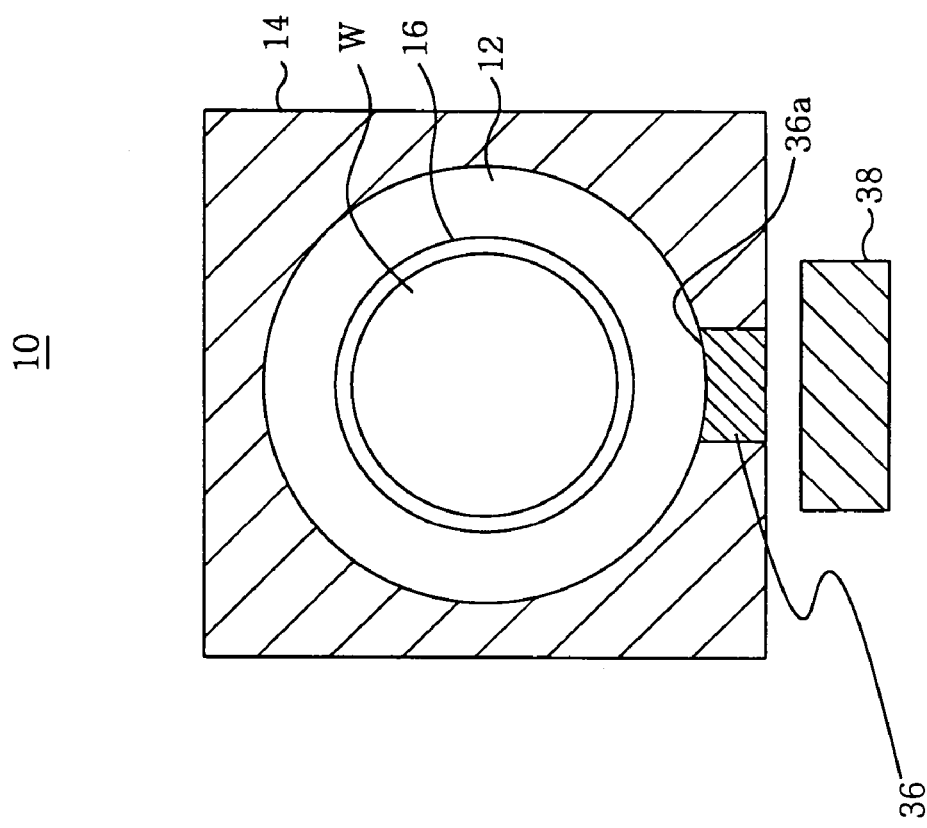
FIG. 2 illustrates a schematic cross sectional top view of the plasma etching apparatus taken along the line X–X' in FIG. 1.

FIG. 2 is a schematic cross sectional view of the plasma etching apparatus 10 taken along the line X–X' in FIG. 1. The observation window 36 has a surface 36*a* facing the processing room 12, a curvature of the surface 36*a* being substantially the same as that of an inner wall of the processing chamber 14. With such an arrangement, the observation window 36 can be installed at the wall of the processing chamber 14 without incurring a protruded or recessed portion with respect to the processing chamber 14, so that a stable plasma processing can be carried out.

Figure 3:
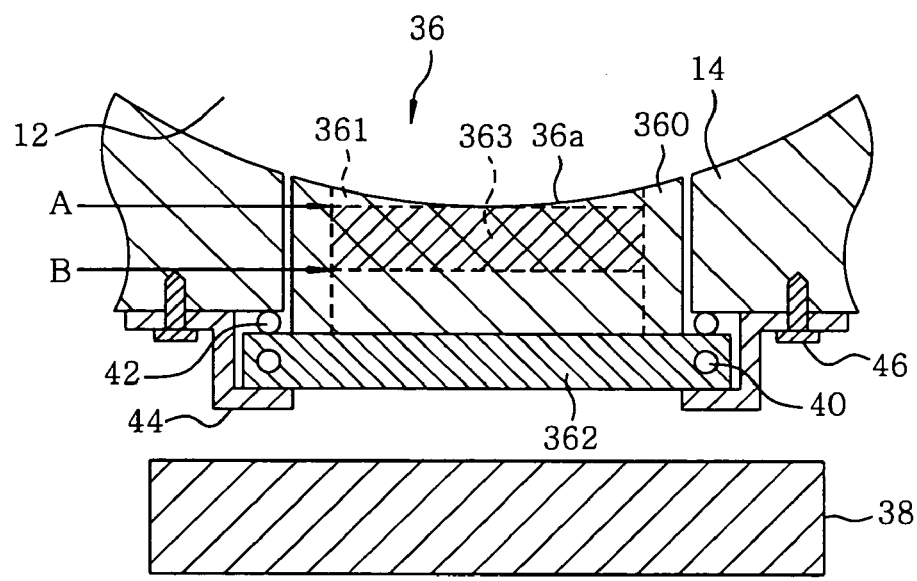
FIG. 3 describes an enlarged view showing the structure of an observation window in accordance with a preferred embodiment of the present invention.

FIG. 3 is an enlarged view showing the observation window 36 and its neighboring region in FIG. 2.

As shown in FIG. 3, the observation window 36 has the surface 36*a* having a curvature substantially the same as that of the inner wall of the processing chamber 14, and an O-ring 42 is installed at a peripheral portion of the observation window 36. When the observation window 36 is fastened to the processing chamber 14 through one or more fixing plates 40 by, e.g., bolts 46, the O-ring 42 comes in a close contact with the wall of the processing chamber 14. In this way, a transparent member 362 of the observation window 36 functions as a sealing member for keeping the processing room 12 airtight. Further, a heater 40 of a substantially annular shape is installed inside, e.g., the transparent member 362 of the observation window 36. By heating the observation window 36, it is possible to prevent or reduce the adhesion of reaction products generated during plasma processing on the observation window 36. Parts represented by reference numerals 360, 361, 362 and 363 in FIG. 3 will be described with reference to FIGS. 4 to 5.

Figure 4:
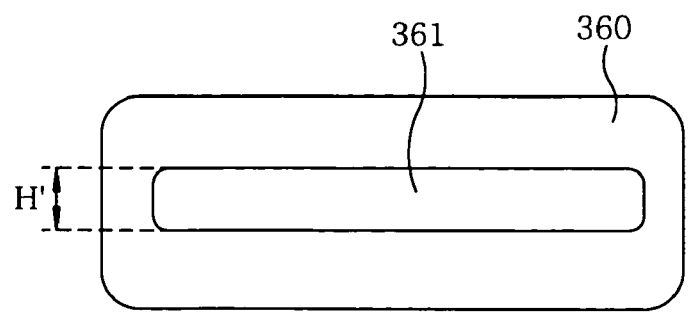
FIG. 4 offers a front view of the observation window in FIG. 3 taken from a processing room.
Figure 5:
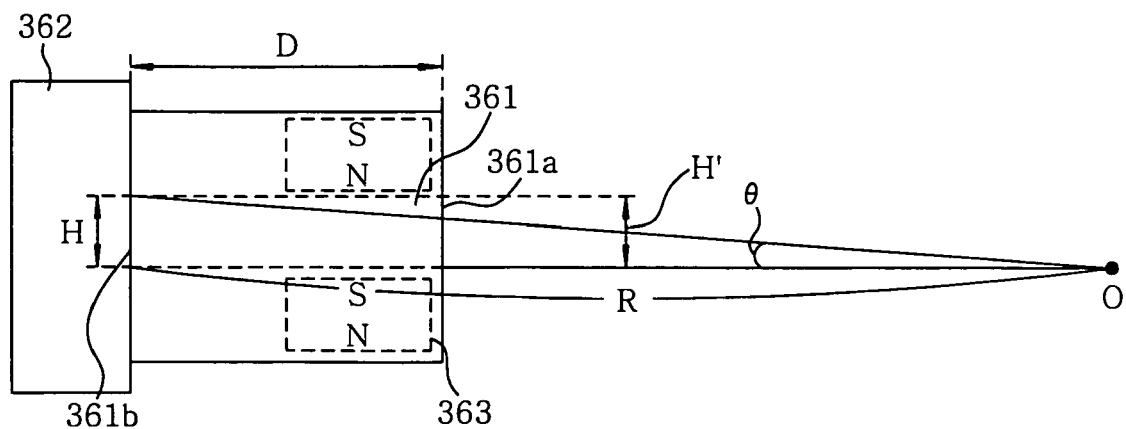
FIG. 5 represents a right side view of the observation window in FIG. 3.

FIG. 4 is a front view of the observation window 36 taken from the side of the processing room 12 in FIG. 3. FIG. 5 is a right side view of the observation window 36 in FIG. 3.

As shown in FIGS. 3 to 5, the observation window 36 includes a body 360 having a through hole 361 provided therethrough with an opening 361*a* facing the processing room 12; the transparent member 362 installed at a side of the hole 361 opposite to the processing room 12; a magnetic pole pair 363 having two different magnetic poles of opposite magnetic polarities. The magnetic poles are disposed opposite to each other with the hole 361 interposed therebetween. The magnetic pole pair 363 has a sufficient magnetic field strength to prevent electrons which form plasma in the processing room 12 from reaching the transparent member 362 through the hole 361. The magnetic field strength of the magnetic pole pair is set preferably depending on the size of the processing room 12 and electron energy. The body 360 may be made of silicon; quartz; anodic oxidized aluminum; alumina; sintered ceramic such as yttrium; and a material on which such ceramic is thermally sprayed, carbon, SiC or the like. As shown in FIG. 3, the magnetic pole pair 363 is preferably installed in an area between lines A and B. The line A is tangential to the surface 36*a* of the observation window 36 and parallel to a surface of the transparent member 363 facing the processing room 12, and the line B is substantially at a middle of the line A and the surface of the transparent member 363 facing the processing room 12. The transparent member 362 is preferably made of a material such as quartz or sapphire capable of transmitting a laser light.

In the preferred embodiment of the invention, the hole 361 is slit-shaped with a substantially rectangular cross section having two longer and two shorter sides as shown in FIG. 4; and the magnetic pole pair 363 is embedded inside the body 360 at the two opposing longer sides. The observation window 36 in accordance with the preferred embodiment of the present invention has unique features explained below.

(A) The Height H of the Inner End 361*b* and the Height H' of the Opening 361*a* of the Hole 361

As shown in FIGS. 1 to 5, the height H of the inner end 361*b* of the hole 361 is set in such a manner that an angle $\theta$ as viewed at the particle measuring location O is 1.5° or more (1.5° condition). That is, an angle between the line connecting the particle measuring location O to the highest point (the upper edge in case of the slit-shaped hole) of the inner end 361*b* and the line connecting the particle measuring location O to the lowest point (the lower edge in case of the slit-shaped hole) of the inner end 361*b* is set to be 1.5° or more. In this way, a backside scattered light of laser can be sufficiently collected by the particle measuring instrument 38.

In case of setting the angle $\theta$ to be 1.5°, a concrete dimension of the height H of the inner end 361*b* of the hole is as follows:

The processing room for processing a wafer having a diameter of 200 mm has a diameter of about 450 mm. In this case, if the depth D of the hole is set to be 50 mm, R becomes about 375 mm (R=225 mm+100 mm+50 mm) and the height H of the inner end 361*b* of the hole 361 becomes equal to about 375 mm×tan(1.5°), i.e., about 9.8 mm.

The processing room for processing a wafer having a diameter of 300 mm has a diameter of about 600 mm. In this case, if the depth D of the hole is set to be 50 mm, R becomes about 500 mm (R=300 mm+150 mm+50 mm) and the height H of the inner end 361*b* thereof becomes equal to about 500 mm×tan(1.5°), i.e., about 13.1 mm.

Figure 6:
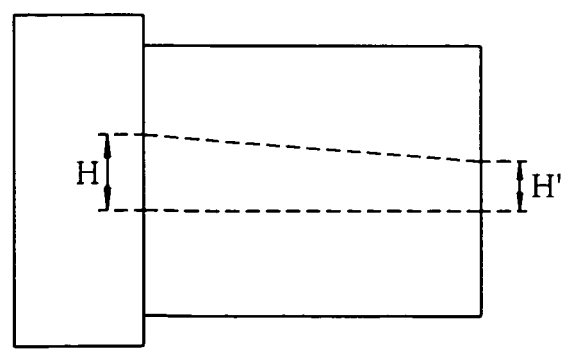
FIG. 6 provides an explanatory view representing a relationship between the height H of an inner end of a hole and the height H' of an opening thereof.

In FIG. 5, the height H' of the opening 361*a* of the hole 361 is equal to the height H of the inner end 361*b* of the hole 361. Alternatively, for example, as approaching the opening 361*a* of the hole 361, the height of the hole may be tailored to become linearly reduced based on the transmission space of a laser light, as shown in FIG. 6. The amount of electrons introduced into the hole 361 can be reduced by making the height H' of the opening 361*a* of the hole 361 smaller than the height H of the inner end 361*b* of the hole 361.

(B) The Ratio of the Height H' of the Opening 361*a* of the Hole 361 to a Depth D Thereof In order to prevent radicals from being deposited at an inner surface of the laser transmission window (i.e., the transparent member 362), the ratio (H':D) of the height H' of the opening 361*a* of the hole 361 to the depth D of the hole 361 may be set to be about 1:4 and more (1:4 condition).

As mentioned above, in case of setting the angle $\theta$ to be about 1.5° and the ratio (H':D) of the height H' to the depth D to be about 1:4, the specific dimension of the depth D of the hole 361 becomes as follows. In this case, the following dimensions are determined under the condition that the height H of the inner end 361*b* of the hole 361 is equal to the height H' of the opening 361*a*.

In case of the processing room for a wafer having a diameter of 200 mm, the depth D of the hole 361 becomes equal to about 9.8 mm×4, i.e., about 39.2 mm.

In case of the processing room for a wafer having a diameter of 300 mm, the depth D of the hole 361 becomes equal to about 13.1 mm×4, i.e., about 52.4 mm. Further, in case of the processing room for a wafer having a diameter of 300 mm, the depth D satisfying both of the 1.5° condition and the 1:4 condition is calculated as about 53 mm to be more exact.

(C) The Magnetic Field Strength of the Magnetic Pole Pair 363

The magnetic pole pair 363 having two different and opposite magnetic poles is installed at an upper and a lower portions of the observation window 36 with the hole 361 interposed therebetween. The magnetic pole pair 363 has a magnetic field strength capable of generating a sufficient magnetic field to prevent electrons with an energy of about 20 eV or less, which is the electron temperature in a typical plasma, from reaching a position inside the middle of the opening 361*a* and the inner end 361*b* of the hole 361 of the observation window 36. In this way, generation of a hollow cathode discharge in the hole 361 serving as a laser transmission space is suppressed, so that a blurring due to deposition on the transparent member 362 can be prevented, which otherwise may be incurred by the discharge.

Figure 7:
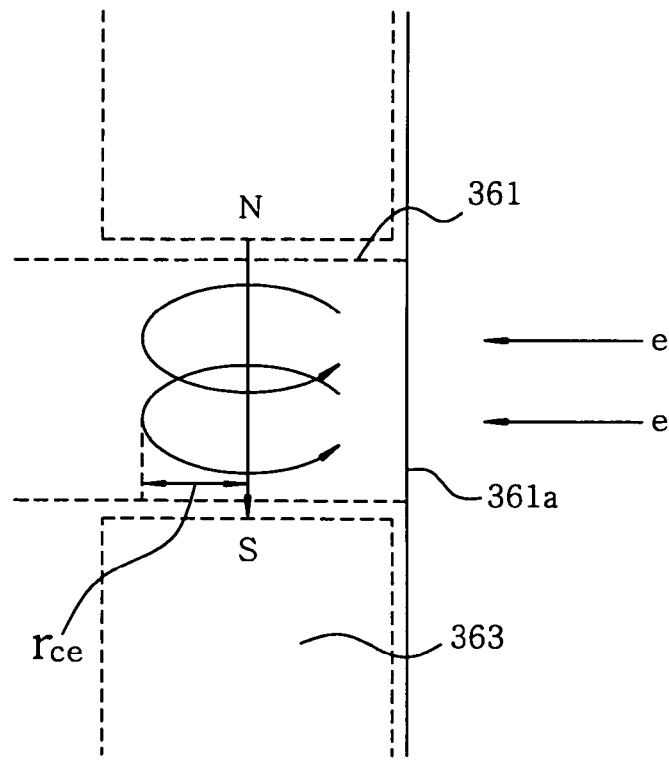
FIG. 7 depicts an explanatory view representing a motion of electrons when the electrons are introduced into the hole.

As shown in FIG. 7, electrons introduced from the plasma into the hole 361 are captured by the magnetic field generated from the magnetic pole pair 363 and carry out a cyclotron motion around the magnetic lines of force produced by the magnetic pole pair with a Larmor radius expressed by the following equation (1). Therefore, the electrons cannot go further into the hole 361 beyond the Larmor radius. In the following equation (1), $r_{ce}$ is a Larmor radius of electron; Ve is an electron temperature; and B is a magnetic flux density:

$$r_{ce}[mm]=38.2 \times Ve^{1/2}[V]/B[Gauss] \qquad \text{Eq. (1)}$$

In the processing room having a diameter of 450 mm for processing a wafer of 200 mm, the height H of the inner end 361*b* of the hole 361 is set to be about 9.8 mm in order to collect a scattered light from an upper part of the end portion of the wafer W farthest from the observation window 36. In case the height H' of the opening 361*a* of the hole 361 is also set to be about 9.8 mm, the depth D of the hole 361 is set to be about 39.2 mm so as to prevent radicals from being deposited on the inner surface of the laser transmission window. In this case, if a magnetic field of about 8.7 G (0.87 mT) or more is generated, the Larmor radius of electrons having an electron temperature of 20 eV or less becomes about 19.6 mm or less. Therefore, the electrons cannot move beyond one half of the depth D into the hole 361.

Similarly, in the processing room having a diameter of 600 mm for processing a wafer of 300 mm, the height H of the inner end 361*b* of the hole 361 is set to be about 13.1 mm in order to collect a scattered light from an upper part of the end portion of the wafer W. In case the height H' of the opening 361*a* of the hole 361 is also set to be about 13.1 mm, the depth D of the hole 361 is set to be about 52.4 mm so as to prevent radicals from being deposited on the inner surface of the laser transmission window. In this case, if a magnetic field of about 6.5 G (0.65 mT) or more is generated, the Larmor radius of electrons having an electron temperature of 20 eV or less becomes 26.2 mm or less. Therefore, the electrons cannot move beyond one half of the depth D into the hole 361.

Further, the height H' of the opening 361*a* of the hole 361 may be set to be smaller than the height H of the inner end 361*b* of the hole 361 while keeping the depth D unchanged. In this case, the ratio D/H' becomes greater than 4. Therefore, deposition of radicals on the inner surface of the laser transmission window is further suppressed with a same magnetic field being generated. Further, in case of using a gas easily dissociated, the electron temperature becomes lower, e.g., about 15 eV or less. In this case, the Larmor radius of electron also becomes smaller under a same magnetic field. Therefore, it is possible to prevent electrons from being introduced into the hole 361 with a weaker magnetic field.

As mentioned above, in accordance with the preferred embodiment of the present invention, the inner end 361*b* of the hole 361 is configured to have the height H corresponding to about 1.5° when viewed at the observation target location O in the processing room 12. Therefore, in case of performing the observation by using a laser light, a backside scattered light of the laser can be collected sufficiently and, at the same time, electrons can be prevented from reaching the transparent member 362 of the observation window 36.

Further, by setting the ratio between the height H' of an opening 361*a* of the hole 361 and the distance (depth) D from the opening 361*a* to the transparent member 362 to be about 1:4, deterioration of transmittance due to deposition of radicals on the observation window 36 can be prevented. Furthermore, the hollow cathode discharge in the observation window 36 can be prevented, so that measurement can be performed while maintaining the S/N ratio stable for an extended time.

Furthermore, the observation window of the present invention includes the magnetic pole pair 363 which is configured to have a sufficient magnetic field strength to prevent electrons from reaching the transparent member 362 through the hole 361 depending on the size of the processing room 12 and the electron temperature of the electrons that form the plasma in the processing room 12. Therefore, the electrons from the plasma can be prevented from passing through the hole 361 to reach the transparent member 362.

Although the observation window of the plasma processing apparatus and the plasma processing apparatus in accordance with the preferred embodiment of the present invention have been described with reference to the drawings, the present invention is not limited to the above preferred embodiment. It would be apparent to those skilled in the art that various changes and modifications may be made without departing from the scope of the present invention as set forth in the claims. Such changes and modifications are to be construed as being included within the scope of the present invention.

For example, although it has been described in the preferred embodiment that the observation window 36 is used to measure particles generated in the processing room 12, the present invention is not limited thereto. The observation window in accordance with the present invention can be used to perform an endpoint detection by detecting a spectrum of plasma for example. In this case, the transparent member of the observation window may be made of a material at least capable of transmitting the emission spectrum of plasma. Moreover, a spectrum detecting unit for detecting the emission spectrum of plasma generated in the processing room may be installed at a side of the observation window opposite to the processing room.

Further, the observation window and the plasma processing apparatus in accordance with the present invention may also be applied to a detection of a reflected or scattered light by particles or uneven patterns on a wafer surface by irradiating a laser light to the wafer surface.

Further, it has been described in the preferred embodiment that a particle measuring instrument is installed at the side of a single observation window opposite to the processing chamber and the particle measuring instrument includes a laser irradiating unit and a laser detecting unit.

However, the present invention is not limited thereto. The plasma processing apparatus may be provided with a plurality of observation windows, each observation window including a laser irradiating unit and a laser detecting unit. In this case, each laser irradiating unit may be installed opposite to a laser detecting unit across the processing room.

In addition, though a heater 30 is installed in the observation window 36 in the preferred embodiments, the present invention is not limited thereto. The heater is not always needed in the present invention. Further, it is possible to install a unit for collecting a laser light or an emission spectrum of plasma at the observation window 36.

Figure 8:
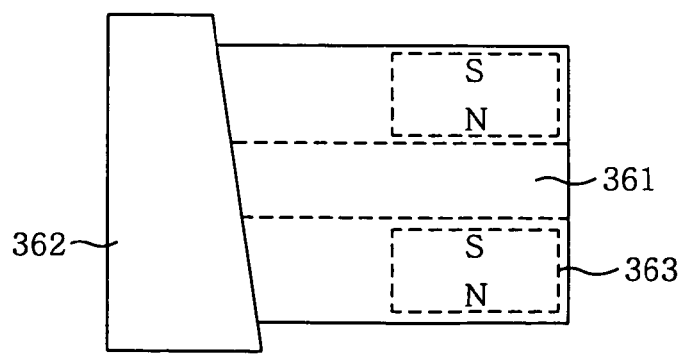
FIG. 8 presents an explanatory view illustrating the structure of an observation window in accordance with another preferred embodiment of the present invention.

Moreover, whereas the preferred embodiment has a laser receiving surface (i.e., the inner end 361b) of the transparent member 362 oriented perpendicular to an axial direction of the hole 361 as shown in FIG. 5, the present invention is not limited to the above. For example, as shown in FIG. 8, the transparent member 362 may be configured to have the inner end 361b of the hole 361 slanted to a certain degree from a direction perpendicular to the axial direction of the hole 361. In this way, a laser light may be incident on the surface of the transparent member 362 at an angle other than 90° and thus transmittance can be increased by lowering an reflectance of the laser light at the surface of the transparent member 362.

Furthermore, in the preferred embodiments, the plasma etching apparatus 10 has been described as an example of a plasma processing apparatus and a semiconductor wafer has been exemplified as an object to be processed. However, the observation window of the plasma processing apparatus in accordance with the present invention may be applied to any plasma processing apparatus. For example, it may be applied to a plasma ashing apparatus besides the plasma etching apparatus. In addition, an LCD glass substrate or the like may be used as an object to be processed.

While the invention has been shown and described with respect to the preferred embodiments, it will be understood by those skilled in the art that various changes and modifications may be made without departing from the spirit and scope of the invention as defined in the following claims.

What is claimed is:

1. A plasma processing apparatus comprising:
   (a) an observation window installed at a sidewall of a processing room thereof, the observation window comprising:
       (i) a through hole with an opening facing the processing room;
       (ii) a transparent member installed at a side of the hole opposite to the processing room; and
       (iii) a magnetic pole pair having two different magnetic poles disposed opposite each other with the hole interposed there between, the magnetic pole pair being configured to have a sufficient magnetic field strength to prevent electrons which form plasma in the processing room from reaching the transparent member through the hole;
   (b) a laser irradiating unit at a side of the observation window opposite the processing room, the laser irradiating unit irradiating a laser light into the processing room through the observation window; and
   (c) a laser detecting unit detecting a reflected light or a scattered light through the observation window, the reflected light or the scattered light being generated when the laser light irradiated into the processing room is irradiated to floating particles in the plasma,
   wherein the observation window has a surface having a curvature substantially the same as that of an inner wall of the processing room;
   a first end of the hole adjoining the transparent member has a height corresponding to about 1.5° when viewed at an observation target location in the processing room; and
   the height of the opening of a second end of the hole facing the processing room is smaller than that of the first end,
   wherein the observation target is located near a perimeter of a holder of a wafer to be processed at a farther end of the wafer to be processed with respect to the observation window.

2. The plasma processing apparatus of claim 1, wherein the hole has a slit shape with a substantially rectangular cross section with two opposite longer sides and the magnetic pole pair is disposed at the longer sides of the hole.

* * * * *